United States Patent [19]
Kimble et al.

[11] Patent Number: 5,567,902
[45] Date of Patent: Oct. 22, 1996

[54] METHOD AND APPARATUS FOR OPTICALLY SENSING THE POSITION AND VELOCITY OF PIANO KEYS

[75] Inventors: Thomas E. Kimble; David R. Wade, both of Cincinnati, Ohio

[73] Assignee: Baldwin Piano and Organ Company, Loveland, Ohio

[21] Appl. No.: 369,882

[22] Filed: Jan. 6, 1995

[51] Int. Cl.⁶ ............................. G10H 1/02; H03K 17/94
[52] U.S. Cl. ........................ 84/658; 84/DIG. 7; 341/31; 356/28
[58] Field of Search ........................... 84/615, 626, 644, 84/658, 670, 687–690, 719, 720, 724, 744, 745, DIG. 7; 341/31; 356/28

[56] References Cited

U.S. PATENT DOCUMENTS

| | | |
|---|---|---|
| 3,223,769 | 12/1965 | Wroblewski . |
| 3,513,247 | 5/1970 | Anderson et al. . |
| 3,715,950 | 10/1972 | Nordquist . |
| 3,845,683 | 11/1974 | Lehmann . |
| 4,028,977 | 6/1977 | Ryeczek . |
| 4,092,640 | 5/1978 | Satoh . |
| 4,362,934 | 12/1982 | McLey . |
| 4,429,607 | 2/1984 | Meno . |
| 4,768,412 | 9/1988 | Sanderson . |
| 4,815,353 | 3/1989 | Christian . |
| 4,974,482 | 12/1990 | Tamaki et al. . |
| 5,034,602 | 7/1991 | Garcia, Jr. et al. . |
| 5,107,748 | 4/1992 | Muramatsu et al. ........................ 84/658 |
| 5,164,532 | 11/1992 | Ishii et al. .............................. 84/724 X |
| 5,200,562 | 4/1993 | Kaneko et al. . |
| 5,214,232 | 5/1993 | Iijima et al. . |

FOREIGN PATENT DOCUMENTS

| | | |
|---|---|---|
| 4243294A | 8/1992 | Japan . |
| 1647629A | 5/1991 | U.S.S.R. . |
| 2178216 | 2/1987 | United Kingdom . |

OTHER PUBLICATIONS

MIDI Show Control (MSC) 1.0, MIDI 1.0 Recommended Practice RP–002, *The International MIDI Association,* Los Angeles, CA, Jul. 25, 1991.
MIDI 1.0 Detailed Specification, Document Version 4.0., *The International MIDI Association,* Los Angeles, CA, Jun., 1998.

*Primary Examiner*—Stanley J. Witkowski
*Attorney, Agent, or Firm*—Frost & Jacobs

[57] ABSTRACT

An electronic keyboard musical instrument is provided having optical emitters and detectors both positioned beneath each of the instrument's keys, whereby optical energy is emitted upon the bottom reflective surface of the key and the reflected light is detected. The distance between the optoelectronic sensor and the bottom of the key is detected by the light detector which produces an analog output signal and, by measuring the time between a first and second threshold crossing, the key's velocity can be determined. The two thresholds are preferably chosen to measure a rising voltage as the key is depressed, and the threshold values are preferably chosen at 50% of key travel and 75% of key travel. By use of these thresholds, a relatively clean and useful waveform is available at both threshold crossings, particularly since the mechanical movement of the key has nearly reached its terminal velocity. Electronics in the keyboard instrument sequentially scan each of the output voltages produced by their corresponding light detectors so that a single microprocessor can measure all of the key position values. A single set of threshold voltages can be utilized for all of the keys of the keyboard instrument, if desired, or each of the keys can have its own individual threshold values depending upon the calibration values for its zero and span conditions. The time interval between threshold crossings can be determined, which in turn is used to determine the velocity of each key as it is being depressed. Once the velocity is known, the volume for that key's particular musical tone can be controlled by a sound engine, as well as its other characteristics, such as timbre, attack, and envelope.

25 Claims, 5 Drawing Sheets

METHOD AND APPARATUS FOR OPTICALLY SENSING THE POSITION AND VELOCITY OF PIANO KEYS

TECHNICAL FIELD

The present invention relates generally to pianos, organs, and other electronic keyboard musical instruments and is particularly directed to a piano having optical sensors to detect the movement of the piano keys. The invention is specifically disclosed as a piano having a light emitting diode (LED) beneath each key that shines light against the bottom of the key, after which the light is reflected in a downward direction and a portion of that light impacts a phototransistor.

BACKGROUND OF THE INVENTION

The advent of the electric piano has required that the movement of the piano keys be detected in a manner that creates an electrical signal for each of the piano keys. Various methods of creating an electrical signal have been used, and one method of detecting the key movement is to use optical sensors to detect a change of position of the piano key. One conventional piano key movement detecting scheme using optical means is disclosed in Sanderson (U.S. Pat. No. 4,768,412) which discloses a portable music recording device that sits on top of a piano keyboard and uses optical means to detect when a key has been depressed. A "piston" is attached to each of the keys, and a "wiper" is attached to the piston. When a key is in its UP position, light can travel from an LED to a phototransistor; when a key is in its DOWN position, the light is blocked by the wiper.

Another conventional electronic keyboard is disclosed in Tamaki (U.S. Pat. No. 4,974,482) which discloses an electronic keyboard in which a movable shutter plate is mounted on the bottom of each of the piano keys. A "guide block" contains a conduit through which light from an LED is directed onto a phototransistor. A slit is formed in the guide block through which the shutter plate can pass, and when the key is in its UP position, the light path through the conduit is open because the shutter plate is not blocking the light path within the slit. When the key is depressed (i.e., DOWN), the shutter plate blocks the light path, thereby changing the output voltage of the phototransistor.

Other conventional electronic keyboard instruments that use shutters or flags to interrupt light beams are disclosed in McLey (U.S. Pat. No. 4,362,934) and Potts (GB 2 178 216 A).

Some of the conventional electronic keyboard instruments use optical components to sense other portions of the piano action besides the keys themselves. For example, Kani (JP 4-243294(A)) discloses a keyboard instrument in which a screen having variations in color shade, hue, and surface inclination is attached on the back check of the action for each of the keys. An LED shines light upon this screen, and the resulting reflection is detected by a phototransistor.

In each of the conventional electronic keyboard instruments that detect the motion of the keys, additional mechanical components are attached to some portion of the key so that a shutter or flag is ultimately positioned to block a light path somewhere along the travel of the key. Furthermore, more than one phototransistor is used to detect the movement of each key in some of the conventional keyboard instruments. These extra mechanical components are potential problem areas that may go out of adjustment, thereby degrading the proper operation of the keyboard instrument.

SUMMARY OF THE INVENTION

Accordingly, it is a primary object of the present invention to provide an electronic keyboard musical instrument having an optoelectronic device positioned beneath each of the keys that emits light against the bottom surface of each key and detects the reflected light of that key, thereby determining the mechanical position of each of the keys.

It is another object of the present invention to provide an electronic keyboard musical instrument that uses optoelectronic components to detect the positions of the keys without the use of any type of shutter or flag to block one of the light paths that is used to determine the keys' position.

It is a further object of the present invention to provide an electronic keyboard musical instrument that uses reflected light against the bottom of the keys to determine the mechanical position of each key while also determining the velocity of each of the keys, then using that information to control the volume, timbre, and/or other characteristics of the tones produced by the electronic keyboard instrument.

It is yet another object of the present invention to provide an electronic keyboard musical instrument that uses optoelectronic components to sense reflected light from the bottom of the keys and is constructed in a modular manner so that each array of optoelectronic components is used to actuate one octave of the instrument's range, and multiple arrays can be assembled to cover a piano's or organ's entire range.

It is a yet further object of the present invention to provide an electronic keyboard musical instrument that uses optoelectronic components to detect reflected light from the bottom of the keys and exhibits an automatic calibration function that compensates for the variations caused by casual assembly, electronic variation among sensors and accompanying circuits, and variations among the reflective surfaces.

Additional objects, advantages and other novel features of the invention will be set forth in part in the description that follows and in part will become apparent to those skilled in the art upon examination of the following or may be learned with the practice of the invention.

To achieve the foregoing and other objects and in accordance with one aspect of the present invention, an improved electronic keyboard musical instrument is provided in which an optoelectronic sensor is positioned beneath each of the instrument's (e.g., an acoustic piano's, or an electronic piano's or organ's) keys, whereby a light source shines optical energy upon the bottom reflective surface of the key, and the reflected light is detected by an optical energy detector. The distance between the optoelectronic sensor and the bottom of the key can be determined by the analog voltage produced by the light detector and, by measuring the elapsed time between a first and second threshold crossing, the key's velocity can be measured as well. A separate optoelectronic device (i.e., including both a light source and light sensor) is positioned beneath each of the keys of the instrument, so that the electronic circuitry of the keyboard instrument can determine which one or group of the keys is depressed at any given moment. The optical sensors are preferably assembled in multiple groups of 12, thereby covering an entire octave of a piano's range. In addition, it is preferred that the optoelectronic components be chosen to emit and detect light in the infrared spectrum, which works very well with detecting the surfaces of the wooden keys without having to apply any special type of reflective paint or other type of coating. Other alternative materials could be used with or without reflective coatings, depending upon the wavelength of light chosen for the optoelectronic components.

Electronic circuits of the instrument measure the output voltage of the light sensors and two thresholds are preferably chosen for each light sensor to measure a rising voltage as the key is depressed, in which the first threshold is fixed at approximately 50% of the key travel between the key's rest and depressed positions and the second threshold is fixed at approximately 75% of this key travel. By use of these thresholds, a relatively clean waveform is available at both threshold crossings (and between those thresholds crossings), which is a particularly useful region because the mechanical movement of the key as it is being depressed has nearly reached its terminal velocity by the time these threshold crossings occur. If the voltage of the light detector's waveform is measured at a point earlier during the key's depression, an aberration due to mechanical backlash of the action can render the waveform relatively useless for voltage comparison purposes. A certain waveform oscillation effect due to mechanical oscillation of the key and action at their limits of travel also can interfere with a useful comparison of the voltage if a threshold is chosen at a much later point in the key's travel. In addition, by placing a threshold point near the end travel of the key, it would be more likely that an out-of-specification key travel could prevent the second threshold crossing from occurring at all.

The electronics in the keyboard instrument sequentially scan each of the output voltages from their corresponding light detectors so that a single microprocessor can measure all of the key position values. Each of the output voltages is preferably directed to an analog-to-digital (A/D) converter that is multiplexed and scanned in groups of twelve signals, thereby making it possible to sense an entire octave of the instrument's range with one modular assembly. Once the voltage magnitudes have been digitized by the A/D converter, the resultant digitized values can be easily further "multiplexed" by use of the address and data buses included in the microprocessor system. At that point, the resultant digitized values are compared to the threshold values, and the operation of each key can be detected.

A single set of threshold voltages can be utilized for all of the keys of the keyboard instrument, if desired, or each of the keys can have its own individual threshold values depending upon the calibration values for its zero and span conditions. All of these values can be stored in memory which is controlled by the microprocessor, and the zero and span values can be easily determined upon set-up of the keyboard instrument at the factory, or the automatic calibration feature may optionally be accessed in the field so the zero and span values can be further modified by a user and stored in the microprocessor's memory system. Once both threshold values have been determined for each of the keys, the microprocessor simply keeps track of the state of the position of each of the keys, while marking the moment a transition takes place at each of the threshold crossings. By this method, the time interval between threshold crossings can be determined, thereby providing the microprocessor with the information it needs to determine the velocity of each key as it is being depressed. Once the velocity is known, the volume for that key's particular musical tone can be controlled by a sound engine as well as other characteristics, such as its timbre, attack (particularly if a percussive attack that may be provided at the beginning of each of the tones), and envelope (including the corresponding sustain).

Still other objects of the present invention will become apparent to those skilled in this art from the following description and drawings wherein there is described and shown a preferred embodiment of this invention in one of the best modes contemplated for carrying out the invention. As will be realized, the invention is capable of other different embodiments, and its several details are capable of modification in various, obvious aspects all without departing from the invention. Accordingly, the drawings and descriptions will be regarded as illustrative in nature and not as restrictive.

BRIEF DESCRIPTION OF THE DRAWINGS

The accompanying drawings incorporated in and forming a part of the specification illustrate several aspects of the present invention, and together with the description and claims serve to explain the principles of the invention. In the drawings:

DETAILED DESCRIPTION OF THE PREFERRED EMBODIMENT

Reference will now be made in detail to the present preferred embodiment of the invention, an example of which is illustrated in the accompanying drawings, wherein like numerals indicate the same elements throughout the views.

Figure 1:
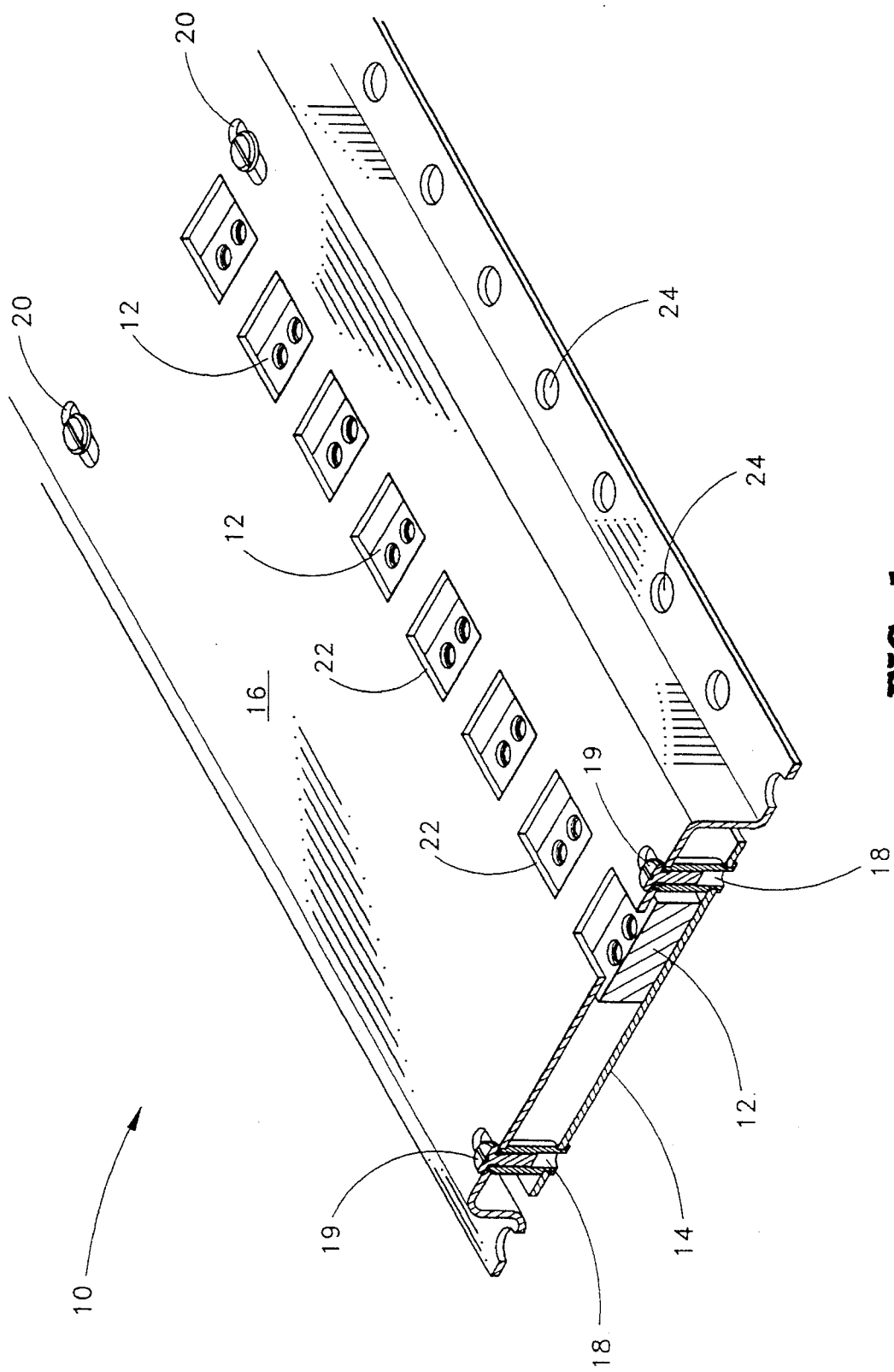
FIG. 1 is a perspective view of a modular optical sensor rail assembly that is placed on the key bed of an electronic keyboard musical instrument and is constructed according to the principles of the present invention.

Referring now to the drawings, FIG. 1 shows a modular optical sensor rail assembly generally designated by the index numeral 10. Sensor rail assembly 10 preferably contains several optoelectronic sensors 12, each having a light emitting diode (LED) 30 and a phototransistor 32 (see FIG. 2), both aiming in the upward direction. A preferred part that is commercially available for optoelectronic sensor 12 is manufactured by Hamamatsu, having a Part No. P5589. Several of these optoelectronic sensors 12 are preferably mounted on a printed circuit board 14, such as a grouping of twelve sensors to cover one octave of keys 38. It will be understood that either more or less than one octave of corresponding sensors 12 can be constructed as a group without departing from the principles of the present invention.

A sensor rail chassis 16 is used to provide sensor rail assembly 10 with mounting locations for printed circuit board 14 by use of threaded stand-offs 18 and screws 19 which fit through slotted holes 20 to provide some lateral adjustment. The lateral adjustment is necessary to accommodate variations in key spacings (which can have wide tolerances even among pianos of the same manufacturer and model number). Windows 22 in plate 16 are located so that LED 30 and phototransistor 32 are not covered in the vertical direction. Chassis 16 is formed into an angular crosssection to provide a mounting base with mounting holes 24, and mounting screws 26 are used to hold the sensor rail assembly 10 in place against a key bed 42.

Figure 2:
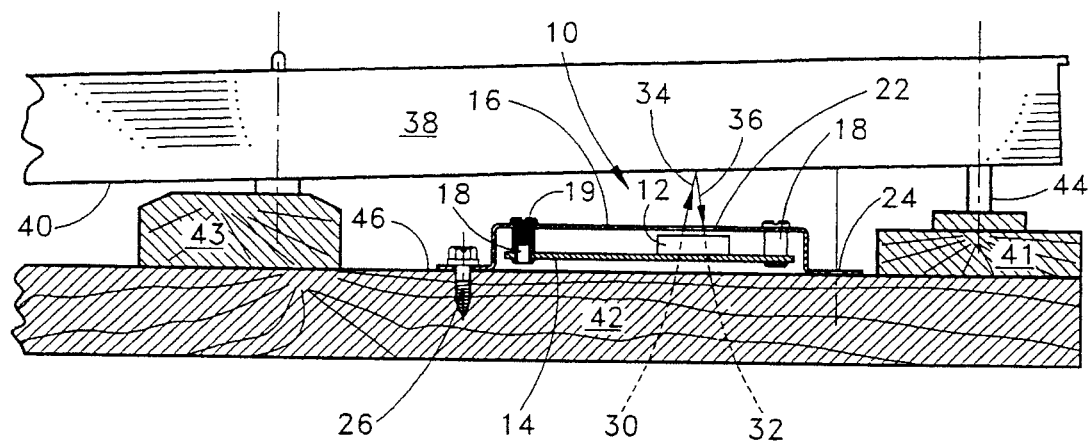
FIG. 2 is a side view of a portion of the optical sensor rail assembly depicted in FIG. 1, in partial cross-section.

As best seen in FIG. 2, LED 30 emits light along a light path 34 until it impacts against the bottom surface 40 of a piano key 38. The light that reflects off of the bottom surface 40 then follows a light path 36 and impacts the phototransistor 32. The preferred optoelectronic sensor 12 emits optical radiation in the infrared range at approximately 900 nanometers (nm), and at this wavelength, the light reflects very well against a bare wood surface of the bottom surface 40 of key 38.

As viewed in FIG. 2, sensor rail assembly 10 is located on the top surface 46 portion of key bed 42 that exists between the front rail 41 and the fulcrum (or balance) rail 43, so as to be placed beneath the piano keys 38. The other mechanical features of the keyboard instrument would remain the same, including a guide pin 44 located near the end of the key 38.

Figure 3:
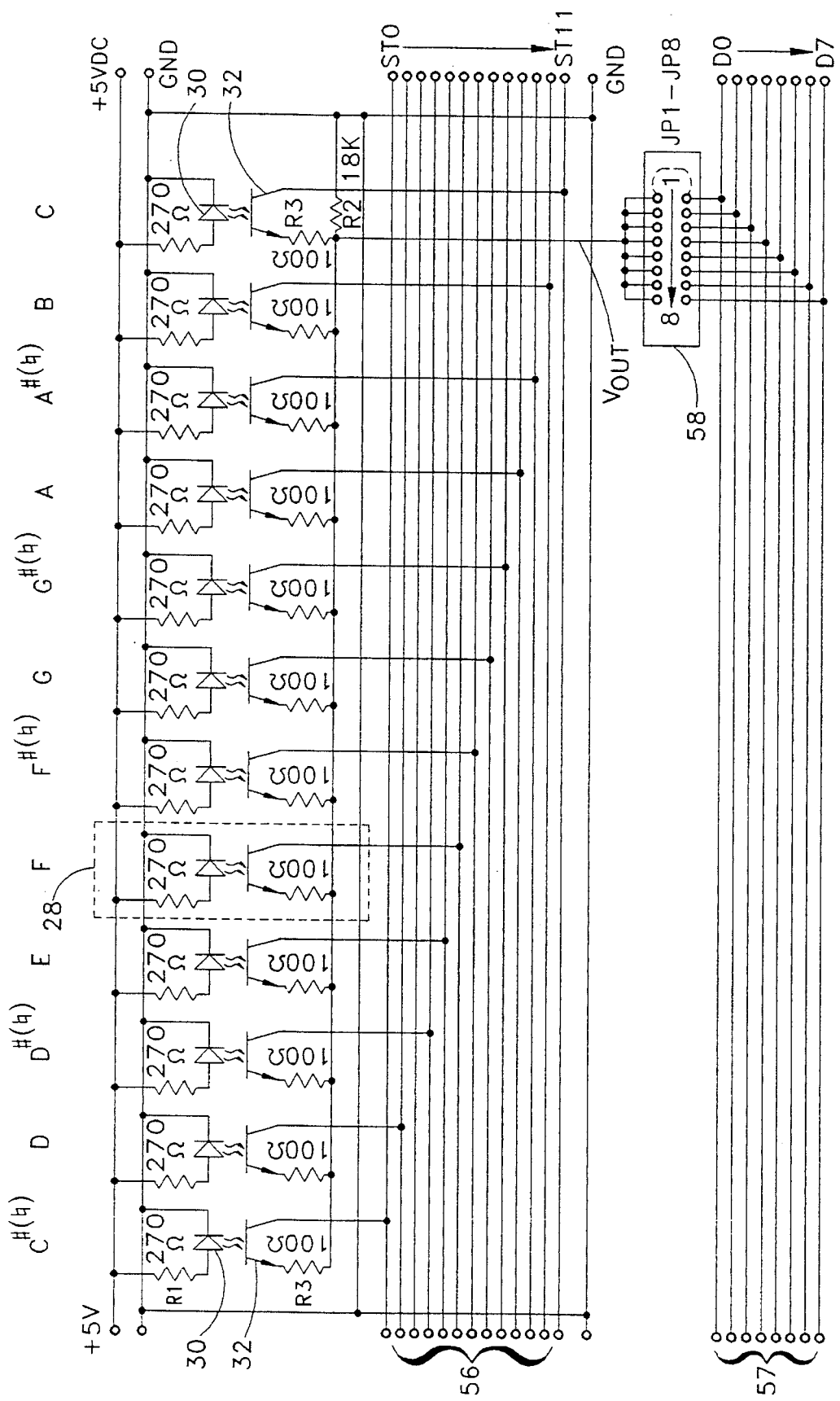
FIG. 3 is an electrical schematic and block diagram showing the major components used in the electronic module that contains several circuits, each having a key detecting circuit of the electronic keyboard musical instrument of FIG. 1.

While the LED 30 and phototransistor 32 are commonly mounted in a single package (i.e., optoelectronic sensor 12), each of these components is electrically isolated from one another. It is preferred that a +5 VDC power supply be used to drive the LED and to bias the phototransistor. In FIG. 3, a current limiting resistor R1 is depicted as being in a series with LED 30. With this +5 VDC power supply, the preferred value for R1 is 270 ohms, thereby providing an LED drive current of 19 mA. As the optical energy emitted by LED 30 is reflected back toward phototransistor 32, its photosensitive base will produce electrons because of the impact of the photons from the optical energy.

As can be seen in FIG. 3, an array of twelve optoelectronic sensors are placed upon a single printed circuit board 14 of an optical sensor rail assembly 10, thereby providing twelve separate LEDs 30 and twelve phototransistors 32. As related in the previous paragraph, each LED has a 270 ohm resistor (designated R1) to control the amount of drive current through each LED 30. Each LED 30 has a corresponding phototransistor 32 (i.e., as part of optoelectronic sensor 12), and each of these phototransistors 32 is connected to a current limiting resistor R3 at its emitter. The preferred value for R3 is 100 ohms. The entire package of a 270 ohm resistor R1, LED 30, phototransistor 32, and 100 ohm resistor R3 provides a one-channel distance sensor designated by the index numeral 28 (as seen by the dashed block on FIG. 3).

The emitter of each of the phototransistors 32 is connected, through its current limiting resistor R3, to a common node which becomes the output voltage $V_{out}$, and is connected to a biasing resistor R2 which is then connected to the Ground rail of optical sensor rail assembly 10. The preferred value of biasing resistor R2 is 18K Ω.

Since each of the preferred phototransistors has a breakdown voltage of about 7 VDC, none of the phototransistors 32 will conduct current without some type of forward bias applied to its corresponding collector. Phototransistor 32 will not conduct current even while light is impacting its photosensitive base without this forward biasing. Since the emitters of each of the phototransistors 32 are connected essentially in parallel to a common node (i.e., $V_{out}$), it is preferred that only one of the phototransistors 32 be biased during a particular moment. This is accomplished by use of a strobe bus, designated by the index numeral 56.

Strobe bus 56 has twelve lines, designated ST0 through ST11. When ST0 is actuated, for example, a positive voltage will be applied to the collector the of phototransistor 32 nearest to the left on FIG. 3 (and designated "C-sharp"— also depicted as "C#" on FIG. 3). Upon energization of strobe line ST0, the C# phototransistor 32 will be forward biased, thereby allowing its photosensitive base to place the N-P-N transistor into its conductive state. The output voltage $V_{out}$ is taken from the C# phototransistor and is directed into a DIP switch or jumper block designated by the index numeral 58.

As an alternative construction, shift registers (i.e., encoders) may be placed in the strobe bus 56 to minimize the number of parallel bus lines located upon each of the optical sensor rail assemblies 10 so that, instead of having twelve individual strobe lines ST0–ST11 passing to and from each assembly 10, only four strobe lines that each contain multiplexed information are passed to and from each assembly 10. Of these four strobe lines, three carry "time-shared" information pertaining to several of the input sensors 28, and the fourth acts as a control line. The operation of the strobe bus would essentially remain the same, however, multiplexer 51 would only require a 4-channel capacity instead of having 12 input channels.

DIP switch/jumper block 58 preferably has eight channels, designated by the terms JP1 through JP8. In this preferred embodiment, there are eight optical sensor rail assemblies 10 of twelve input sensors 28 each, which cover all 88 keys of a normal piano's range (see FIG. 4). Since it is desirable to scan each of these 88 keys (one at a time by multiplexing), a separate "Muxed" data bus, generally designated by the index numeral 57, is provided to communicate analog signals from each of the optical sensor rail assemblies 10 to an eight-channel A/D converter 50. The individual Muxed data bus lines are designated D0 through D7. Since it is preferred that only one optical sensor rail assembly 10 have its output voltage $V_{OUT}$ connected to any one of the channels D0 through D7 of Muxed data bus 57, the DIP switch/jumper block 58 for a particular optical sensor rail assembly 10 should only have one of its contacts closed, thereby selecting only one of the data lines D0 through D7 for that particular assembly 10. It will be understood that an analog switch having eight channels of inputs and outputs could easily be substituted for the DIP switch/jumper block 58.

The operation of a particular optical sensor rail assembly 10 is ultimately controlled by a microprocessor that sequentially selects each of the strobe bus lines ST0 through ST11 and each of the Muxed data bus lines D0 through D7. When strobe signal ST0 is selected by the microprocessor, that line is energized, not only for the particular optical sensor rail assembly 10 shown on FIG. 3, but also for all of the other seven such optical sensor rail assemblies 10. When this occurs, the C# channel distance sensor 28 will be selected, and the output voltage from its emitter will become $V_{OUT}$ for that individual optical sensor rail assembly 10. Depending upon the position of the DIP switch/jumper block 58, that particular $V_{OUT}$ will be placed upon one of the Muxed data bus lines D0 through D7. Since this operation is occurring virtually simultaneously for all eight optical sensor rail assemblies 10, the Muxed data bus will presently contain eight different analog voltages, each one related to the C# key's position of one of the octaves of the electronic keyboard instrument.

Figure 4:
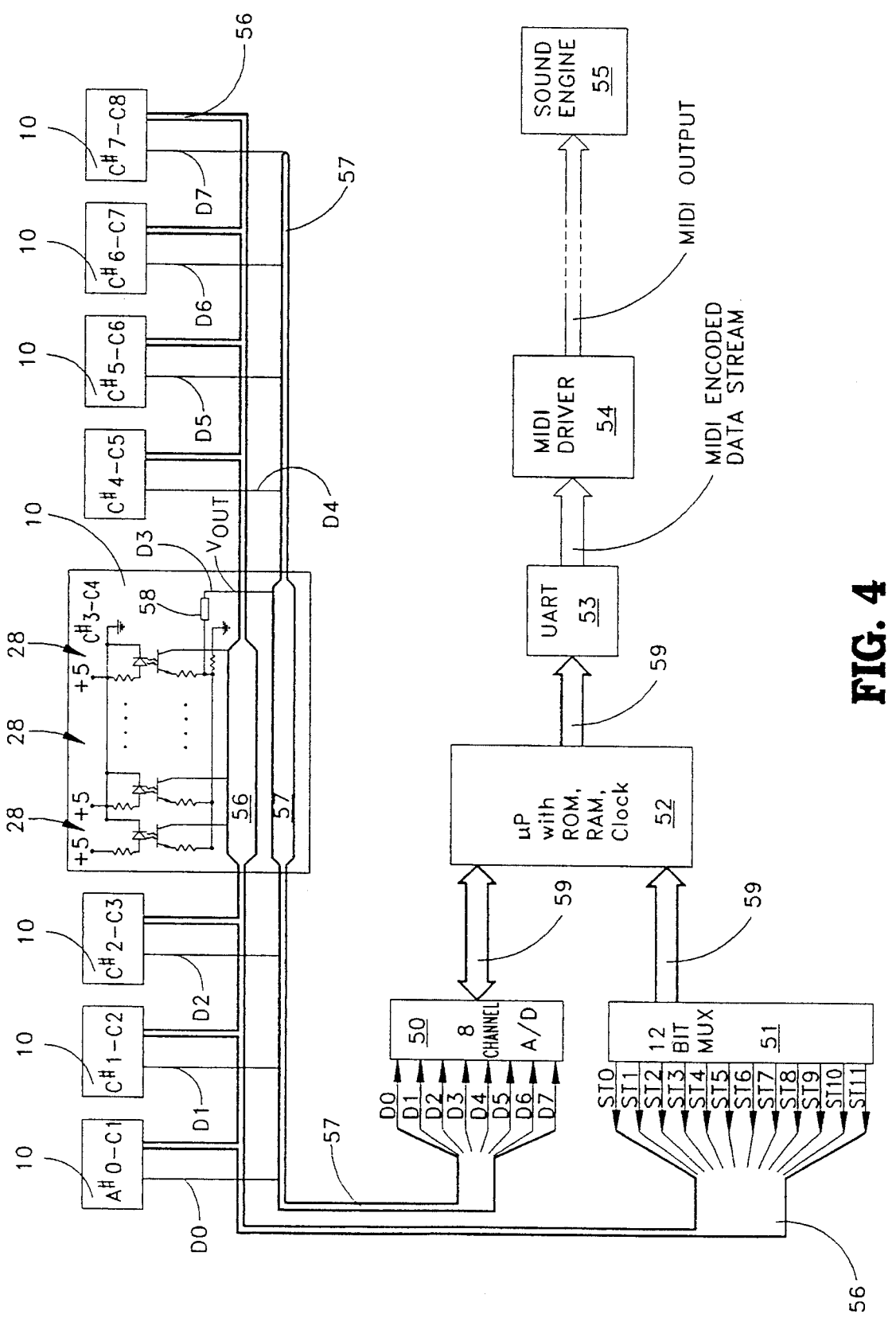
FIG. 4 is an electrical block diagram showing the major components used in the electronic keyboard musical instrument of FIG. 1, including the analog and digital data bus structures between major components, and including the MIDI output.

Referring to FIG. 4, all eight of the Muxed data bus lines D0 through D7 are directed to the inputs of an eight-channel A/D converter, designated by the index numeral 50. The scanning of the A/D converter's inputs is controlled by a microprocessor system (including its associated read only memory (ROM) and random access memory (RAM)), generally designated by the index numeral 52. As is the general practice in microprocessor-based equipment, microprocessor system 52 contains an address bus and a data bus, designated as a combination by the index numeral 59, which is used to control various components within the microprocessor's system. In the present invention, microprocessor system 52 controls the sequencing of A/D converter 50 via its address/data bus system 59, and the sequencing of a twelve-bit multiplexer, designated by the index numeral 51, again via its address/data bus 59.

Multiplexer 51 has its inputs connected to the individual strobe bus lines ST0 through ST11 of the strobe bus 56. Since microprocessor system 52 can control the selection of each of the strobe bus lines ST0 through ST11 and each of the Muxed data bus lines D0 through D7, microprocessor system 52 can individually select any particular key within the keyboard instrument's range that it desires to sense at a particular moment. A preferred method of operation is to have microprocessor system 52 select one of the strobe bus lines ST0 through ST11 and maintain that line active while it then scans through all eight of the Muxed data bus lines D0 through D7. In this manner, microprocessor system 52 would scan through all of the octaves of a particular note (e.g., C-sharp) of the entire electronic keyboard instrument before deactivating that particular strobe bus line. Subsequently, microprocessor system 52 would activate a different strobe bus line to sequentially scan through all of the octaves associated with a second note of the keyboard instrument.

As an alternative sequence of operation, microprocessor system 52 could merely select one of the Muxed data bus lines D0 through D7 and maintain that line active while it then scans through all twelve of its associated single-channel distance sensors 28, by sequencing through each of the strobe bus lines ST0 through ST11. In this manner, microprocessor system 52 would scan through all of the channels of a particular optical sensor rail assembly 10 before deactivating that particular rail assembly's Muxed data bus line and then activating a different Muxed data bus line to then sequentially scan through all of the keys associated with a second optical sensor rail assembly 10.

For example, if the fourth optical sensor rail assembly 10 from the left (on FIG. 4) is selected, designated C#3–C4, and that particular optical sensor rail assembly 10 was associated with Muxed data bus line D3, then microprocessor system 52 would activate Muxed data line D3 while deactivating all other Muxed data bus lines. While doing so, microprocessor system 52 would then sequentially activate each of the inputs of multiplexer 51, thereby activating each of the strobe bus lines ST0 through ST11, one at a time, in a sequential manner. In this example, when the "F" key is to be detected during a particular time slice, the ST4 strobe bus line would be activated for the length of time necessary for the A/D converter 50 to scan and convert the analog input voltage presented by Muxed data bus line D3. It will be understood that the selection of eight channels for A/D converter 50 and twelve bits for multiplexer 51 is merely a matter of design choice, and that other scanning and multiplexing configurations could be substituted without departing from the principles of the present invention. With the present technology, much larger or faster strobe bus and Muxed data bus configurations easily could be constructed.

Microprocessor system 52 is preferably based upon a Motorola 68008 microprocessor, having separate ROM and RAM. Multiplexer 51 is preferably made up of two eight-bit multiplexer chips, in which only a portion of the capacity of one of these chips is utilized to create an effective 12-bit multiplexer. This configuration could easily be changed to a single twelve-bit multiplexer chip, at a cost penalty. The preferred A/D converter 50 is an eight-channel, eight-bit chip, manufactured either by Analog Devices, Inc., part number AD7828, or a Maxim chip, part number MAX158. Analog Devices, Inc. is located in Norwood, Mass., and Maxim is located in Sunnyvale, Calif. These A/D converters are commonly known as "half-flash" converters which use both flash and successive approximation conversion techniques. The preferred A/D converters, listed above, have a conversion time of about 2.5 microseconds (µsec).

It is preferred that all of the keys of the electronic keyboard instrument be scanned within each 2 millisecond (msec) time interval during the operation of the keyboard. If the electronic keyboard instrument is a piano having 88 keys, then a scan time of 22.7 µsec will provide this 2 msec scan time performance. Since this time interval of 22.7 µsec is the base requirement for converting the analog data for a given key of the electronic keyboard instrument, it can be easily seen that the preferred A/D converter provides much greater capability (at 2.5 µsec) than is required for the present invention. In other words, a slower A/D converter chip could be used, if one were available at a reasonable cost.

Once the microprocessor system has obtained the data from each of the keys of the electronic keyboard instrument, it then passes the necessary information to have the corresponding tones generated by some type of sound engine by communicating the proper information to a UART, designated by the index numeral 53, via the address/data bus 59. UART 53 is well known in the art, and is simply a universal asynchronous receiver/transmitter which takes the parallel information that arrives from the address/data bus 59 and converts it to a serial MIDI encoded data stream, which conforms to the MIDI software standard. This data stream is then communicated to a MIDI driver, designated by the index numeral 54, which converts the signal format of the serial data stream from a standard UART output (e.g., a voltage source-type output) into a different format, known as "MIDI output." This MIDI driver is well known in the art, and is disclosed on page 2 of MIDI 1.0 Detailed Specification, document version 4.0, dated June 1988. The signal physical parameters of the MIDI output is also well known in the art, and use a standard optocoupled current communications loop (i.e., being driven by current sources). The MIDI output information is then further communicated to a sound engine 55, or to some other type of sound module for control.

The "music" information that originates with microprocessor system 52, and ultimately ends up at a sound engine 55, not only includes which exact tone is to be generated, but information as to when the tone should start, when the tone should stop, and the key velocity information that is used to determine the tone's volume, attack, envelope, or other parameters. The key velocity information provided by microprocessor system 52 can be used in many different forms, and this essentially is dependent upon the type of sound engine or sound module that is connected at the end of the data stream that originates with microprocessor system 52. In other words, a particular sound engine might take that velocity information and control the tone's volume and attack based upon that information, or it may control the envelope. Any combination of characteristics can be controlled from the velocity information, depending upon how the sound engine or sound module is configured.

Figure 5:
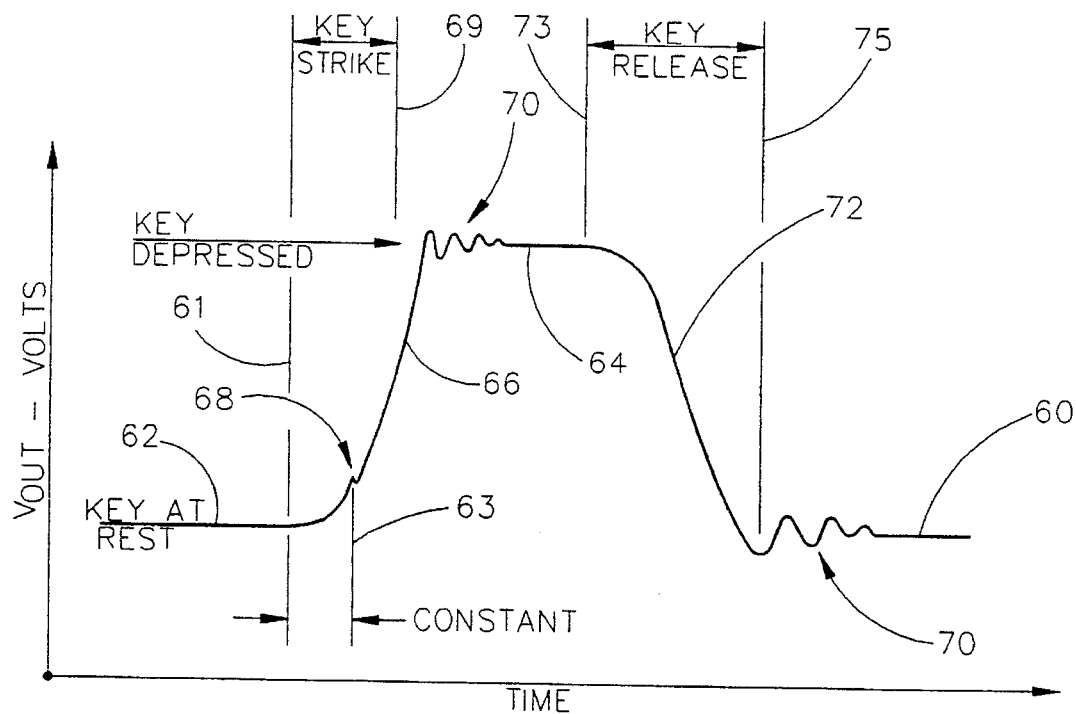
FIG. 5 is a graph showing the voltage waveform versus time of the output voltage of a preferred phototransistor that is generated by a medium key strike of the electronic keyboard musical instrument's electronic circuit of FIG. 3.

FIG. 5 is a graph showing the waveform in volts versus time of the output voltage $V_{OUT}$ of phototransistor 32 during a "medium" key strike. This waveform is depicted by the curve 60, and the use of the word "medium" refers to the force by which key 38 is being depressed by the user of the electronic keyboard instrument. The voltage magnitude is at a minimum when the key is at rest, as depicted by the index numeral 62. The voltage magnitude is at a maximum when the key is depressed, as depicted by the index numeral 64, for the steady state value of the $V_{OUT}$ voltage.

As the key is depressed, the voltage begins to rise as indicated by the time mark indicating the beginning of the key strike, at index numeral 61. Once the key has traveled to its end limit (i.e., once it reaches its fully depressed position), as depicted by the key-depressed limit time mark index numeral 69, the output voltage temporarily "oscillates" (overshoots and undershoots), as depicted by the index numeral 70. This oscillation is due to mechanical oscillation of the key and action at the limits of their travel. The rising waveform is not smooth, because of an aberration that occurs at a constant time interval after the beginning time mark 61. This constant time interval is depicted by the time mark index numeral 63, and it produces a small aberration 68 in the waveform which essentially is due to a low level mechanical oscillation and mechanical backlash in the key and action. Once past the aberration 68, the waveform then rises relatively smoothly, as depicted by a final waveform portion indicated by the index numeral 66, during which time the key is traveling near its terminal velocity for this particular strike. It is during the final waveform portion 66 that the important measurements to determine key position should be taken.

Once the key is released, the waveform will drop in voltage, as depicted by the index numeral 72. On FIG. 5, the beginning of the key release is depicted by the time mark index numeral 73, and the upper end limit of the key's travel occurs at the time mark index numeral 75. A similar mechanical "oscillation" of the key and action takes place at this particular limit of the key's travel and affects the waveform as undershoot and overshoot, as depicted by the second index numeral 70 along the time graph.

Figure 6:
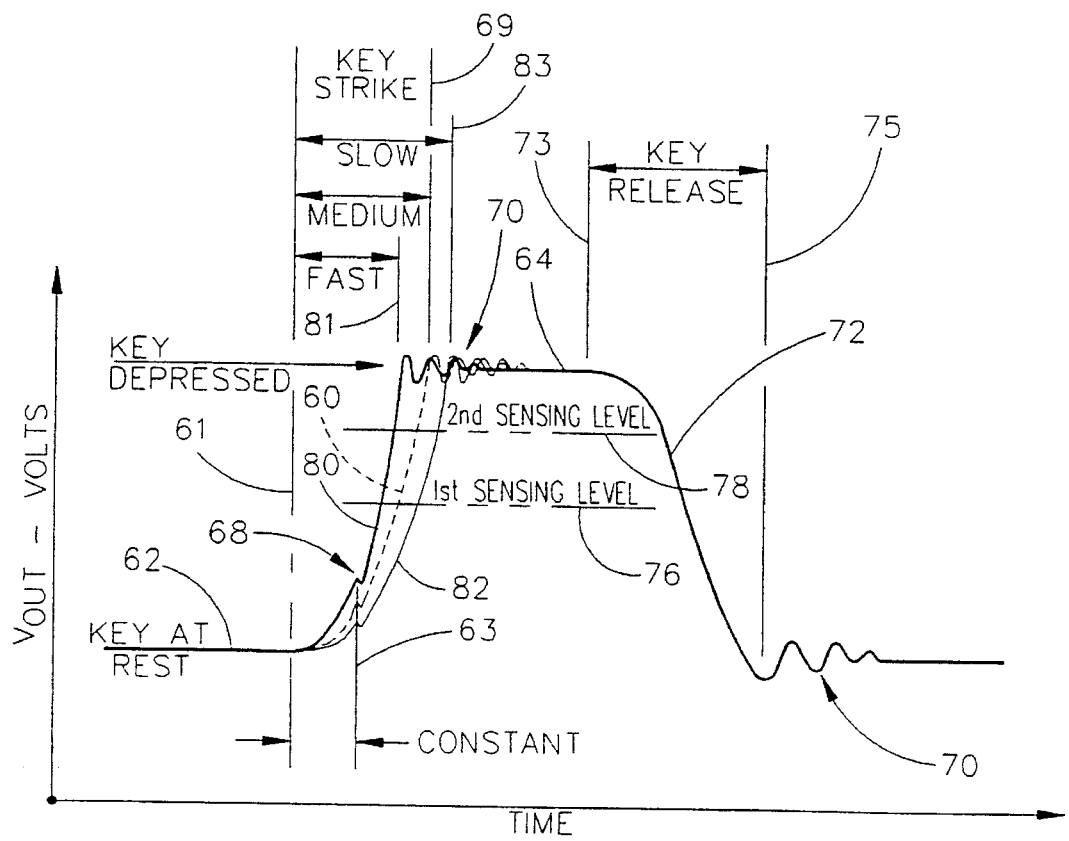
FIG. 6 is a graph of the voltage waveform versus time of the output voltage of a preferred phototransistor that shows the differences between key strike speeds, showing a fast strike, a medium strike, and a slow strike of the electronic keyboard musical instrument's electronic circuit of FIG. 3.

The waveform of the output voltage of phototransistor 32 will have a sharper rise slope and a shorter rise time if the key is struck with a greater force. Similarly, the waveform will have a more gradual slope and a slower rise time if the key is struck with a lesser force. These waveforms are depicted on FIG. 6, in which the "fast" key strike waveform is depicted by the index numeral 80 and the "slow" key strike waveform is depicted by the index numeral 82. As can be seen in FIG. 6, the aberration 68 in the waveform still occurs at the same time interval, as depicted by time mark index numeral 63, regardless of the speed or force of the key strike. The "oscillations" at the end travel limits of the key will still occur, as depicted by the index numerals 70, however, with a greater force and faster strike, the overshoot may be some what greater than with a medium or slow strike.

The voltage sensing thresholds 76 and 78 are depicted on FIG. 6, and their preferred values of 50% and 75% are approximated on this figure. The waveform in all cases has settled into a relatively constant slope by the time the lower threshold 76 is achieved by the output voltage $V_{OUT}$ of phototransistor 32. Similarly, the slope of the waveform has not significantly changed by the time the second or higher threshold 78 is achieved. As related hereinabove, it is preferred that the higher threshold voltage not be increased substantially beyond the 75% value (i.e., 75% of the difference between the "zero" voltage value 62 and the "span" voltage value 64) to keep this threshold a substantial distance from the maximum value (of index numeral 64) and its accompanying oscillations (of index numeral 70).

Note, during a fast key-strike, the key-depressed limit time mark index numeral 81 is achieved much more quickly than the medium time mark limit 69. Similarly, the slow key-depressed limit time mark index numeral 83 is achieved significantly slower than the medium time mark limit 69.

Figure 7:
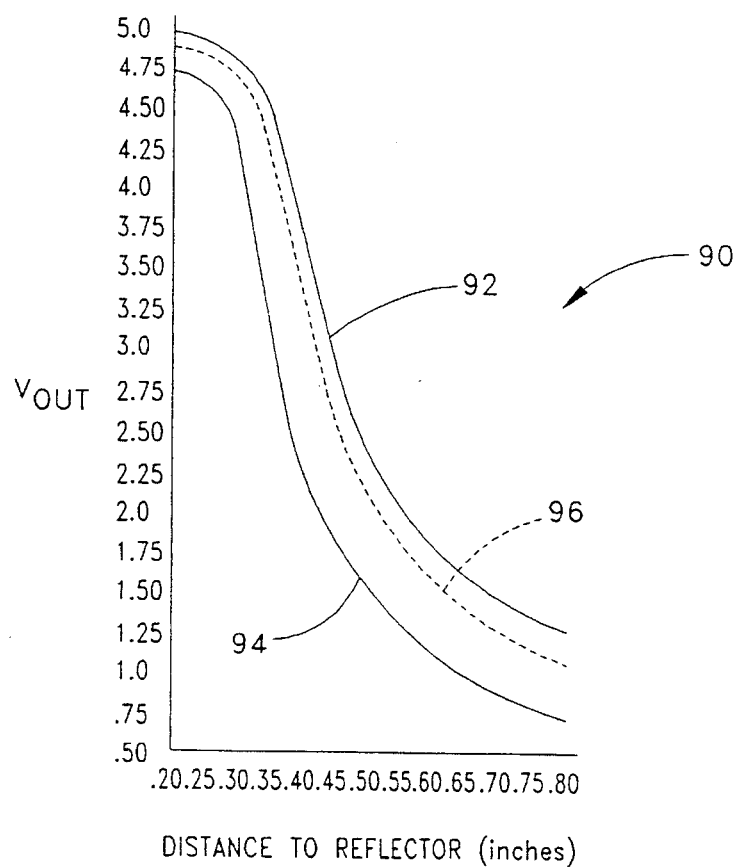
FIG. 7 is a graph of output voltage versus sensing distance of a number of phototransistors showing the range of voltage values versus distance in inches for the tested sample of preferred optoelectronic sensors.

FIG. 7 depicts a graph of the phototransistor's output voltage $V_{OUT}$ versus distance in inches, and is generally designated by the index numeral 90. This graph was generated from measurements taken of twelve different samples of the preferred optoelectronic sensor 12 (i.e., the Hamamatsu P5589) utilized in the circuit and depicted in FIG. 3. Voltage measurements were taken at each 0.05 inch interval within the range of 0.20 inches through 0.80 inches, inclusive. The upper line 92 of graph 90 indicates the maximum value obtained from all twelve samples at each of these distance intervals, whereas the bottom line 94 indicates the minimum value provided by those same samples. The dashed line 96 indicates approximately the arithmetic mean value of all twelve of the samples. It will be understood that an optoelectronic sensor different than the Hamamatsu P5589 (i.e., one having a different part number, or made by a different manufacturer) would still operate in the present invention, but would likely have a voltage vs. distance characteristic curve other than that depicted in FIG. 7.

As is clearly indicated in FIG. 7, $V_{OUT}$ is not linear with respect to the distance between the bottom of the key 38 and the optoelectronic sensor package 12. This non-linearity is, of course, expected in this application. The 50% and 75% threshold values are selected with respect to the minimum voltage value of $V_{OUT}$ when the key is at rest (i.e., at index numeral 62 on FIG. 5) and the maximum value of $V_{OUT}$ when the key is depressed (i.e., at index numeral 64 on FIG. 5). Wherever these minimum and maximum voltage values occur with respect to graph 90 determines the precise voltage magnitudes that will be utilized for thresholds 76 and 78. As related hereinabove, each key could be individually calibrated with respect to its individual high and low threshold magnitudes 78 and 76, respectively, once the zero and span voltage values 62 and 64, respectively, of $V_{OUT}$ are known.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described in order to best illustrate the principles of the invention and its practical application to thereby enable one of ordinary skill in the art to best utilize the invention in various embodiments and with various modifications as are suited to the particular use contemplated. It is intended that the scope of the invention be defined by the claims appended hereto.

We claim:

1. A electronic keyboard musical instrument key position and velocity detector, comprising:

(a) a key having an upper tactile surface, said key being movable by a human user's finger pressing against said tactile surface, said key moving in a substantially vertical direction, said key having a bottom surface including a substantially flat region;

(b) a light source positioned beneath said key, said light source emitting optical energy that is aimed at said substantially flat region on the key's bottom surface for reflecting at least a portion of said optical energy from said substantially flat region;

(c) a light detector positioned beneath said key, said light detector being positioned to receive a portion of the optical energy reflected by said substantially flat region, said light detector producing an analog electrical signal upon its reception of said reflected optical energy, said electrical signal having a magnitude that is related to a distance between said light detector and the substantially flat region of said key; and (d) an electrical circuit that receives said electrical signal produced by said light detector, said circuit including a comparator with two thresholds, a first threshold which is used to determine that the distance between said light detector and said key has changed, and a second threshold which is used to determine the velocity of the key and the user's finger as the distance between said light detector and said key varies.

2. The electronic keyboard musical instrument key position and velocity detector as recited in claim 1, wherein said comparator comprises an analog-to-digital converter and a microprocessor.

3. The electronic keyboard musical instrument key position and velocity detector as recited in claim 1, further comprising: a plurality of keys, light sources, and light detectors; and a multiplexing device that sequentially detects the plurality of electrical signals that are produced by said plurality of light detectors.

4. The electronic keyboard musical instrument key position and velocity detector as recited in claim 1, wherein said substantially flat region of the bottom surface of the key comprises unpainted wood; and said light source emits optical energy in the infrared spectrum.

5. The electronic keyboard musical instrument key position and velocity detector as recited in claim 1, wherein the elapsed time between said electrical signal crossing both said first and second thresholds is measured by an electronic circuit to determine the key's velocity.

6. The electronic keyboard musical instrument key position and velocity detector as recited in claim 1, wherein said substantially flat region of the bottom surface of the key comprises a reflective material.

7. The electronic keyboard musical instrument key position and velocity detector as recited in claim 1, wherein said electrical circuit includes a DC power supply; said electrical signal has a "zero" voltage magnitude near zero volts when said key is not depressed, and a "span" voltage magnitude near the power supply value when said key is depressed; and said first threshold has a value of about 50% between said zero and span voltages, and said second threshold has a value of about 75% between said zero and span voltages.

8. The electronic keyboard musical instrument key position and velocity detector as recited in claim 1, further comprising an electronic sound engine circuit that creates a tone of a particular audio frequency upon actuation of said key as determined by said electrical signal crossing at least one of said first and second thresholds, said electronic circuit being additionally configured to determine the volume of the tone based upon the elapsed time between said first and second threshold crossings.

9. The electronic keyboard musical instrument key position and velocity detector as recited in claim 1, wherein said light source comprises a light-emitting diode and said light detector comprises a phototransistor.

10. The electronic keyboard musical instrument key position and velocity detector as recited in claim 9, wherein said light-emitting diode and phototransistor are mounted in one common package.

11. The electronic keyboard musical instrument key position and velocity detector as recited in claim 9, wherein said electrical circuit includes a DC power supply; and the output voltage of said phototransistor has a "zero" voltage magnitude near zero volts when said key is not depressed, and a "span" voltage magnitude near the power supply value when said key is depressed.

12. A electronic keyboard musical instrument key position and velocity detector, comprising:

(a) a key having an upper tactile surface, said key being movable in a substantially vertical direction by a human user's finger pressing against said tactile surface, said key having a bottom surface that has a substantially flat region;

(b) a light source positioned beneath said key, said light source emitting optical energy that is aimed at said substantially flat region on the key's bottom surface thereby creating a first light path between said light source and said substantially flat region;

(c) a light detector positioned beneath said key and adjacent to said light source, said light detector further positioned to receive a portion of the optical energy that flows through said first light path and is reflected by said substantially flat region, said reflection thereby creating a second light path between said substantially flat region and said light detector, said light detector producing an analog voltage and current upon its reception of optical energy flowing through said second light path, said analog voltage and current having magnitudes that are related to a length of said second light path; and (d) an electrical circuit that receives said voltage and current produced by said light detector, said circuit including a comparator with two thresholds, a first threshold which is used to determine that the length of said second light path has changed, and a second threshold which is used to determine the velocity of the key and the user's finger as the length of said second light path varies.

13. The electronic keyboard musical instrument key position and velocity detector as recited in claim 12, wherein said comparator comprises an analog-to-digital converter and a microprocessor.

14. The electronic keyboard musical instrument key position and velocity detector as recited in claim 12, further comprising: a plurality of keys, light sources, and light detectors; and a multiplexing device that sequentially detects the plurality of electrical signals that are produced by said plurality of light detectors.

15. The electronic keyboard musical instrument key position and velocity detector as recited in claim 12, wherein said substantially flat region of the bottom surface of the key comprises unpainted wood; and said light source emits optical energy in the infrared spectrum.

16. The electronic keyboard musical instrument key position and velocity detector as recited in claim 12, wherein said electrical circuit includes a DC power supply; said electrical signal has a "zero" voltage magnitude near zero volts when said key is not depressed, and a "span" voltage magnitude near the power supply value when said key is depressed; and said first threshold has a value of about 50% between said zero and span voltages, and said second threshold has a value of about 75% between said zero and span voltages.

17. The electronic keyboard musical instrument key position and velocity detector as recited in claim 12, further comprising an electronic circuit that creates a tone of a particular audio frequency upon actuation of said key as determined by said electrical signal crossing at least one of said first and second thresholds, said electronic circuit being additionally configured to determine both volume and timbre of the tone based upon the elapsed time between said first and second threshold crossings.

18. The electronic keyboard musical instrument key position and velocity detector as recited in claim 12, wherein said light source comprises a light-emitting diode and said light detector comprises a phototransistor.

19. The electronic keyboard musical instrument key position and velocity detector as recited in claim 18, wherein said light-emitting diode and phototransistor are mounted in one common package.

20. The electronic keyboard musical instrument key position and velocity detector as recited in claim 18, wherein said electrical circuit includes a DC power supply; and the output voltage of said phototransistor has a "zero" voltage magnitude near zero volts when said key is not depressed, and a "span" voltage magnitude near the power supply value when said key is depressed.

21. A method of determining the position and velocity of an electronic keyboard musical instrument key, comprising the steps of:
(a) providing a key having an upper tactile surface, said key being movable by a human user's finger pressing against said tactile surface in a substantially vertical direction, said key having a bottom surface including a substantially flat region;
(b) emitting optical energy from a light source positioned beneath said key, said optical energy being aimed at said substantially flat region on the key's bottom surface, and at least a portion of said optical energy being reflected from said substantially flat region;
(c) detecting said reflected optical energy via a light detector positioned beneath said key, and producing an analog electrical signal related to a distance between said light detector and the substantially flat region of said key; and
(d) receiving said electrical signal produced by said light detector via an electrical circuit, and determining the moment of time when said electrical signal crosses both a first and a second threshold, thereby determining via said first threshold when the distance between said light detector and said key has changed, and via said second threshold the velocity of the key and the user's finger as distance between said light detector and said key varies.

22. The method as recited in claim 21, further comprising providing a plurality of electronic keyboard musical instrument keys, light sources, light detectors, and electrical circuits; emitting optical energy from each of said plurality of light sources positioned beneath each of said keys; detecting said reflected optical energy from each of said keys via said plurality of light detectors positioned beneath said keys; producing a plurality of continuously variable electrical signals related to said reflected optical energy from each of said keys; and sequentially determining a plurality of first threshold crossings and second threshold crossings when the distances between each of said light detectors and each of the keys has changed, and determining the velocity of each of the keys as the distances between each of said light detectors and each of said keys vary.

23. The method as recited in claim 21, further comprising providing a DC power supply; and wherein during the step of producing a continuously variable electrical signal related to said reflected optical energy said electrical signal has a "zero" voltage magnitude near zero volts when said key is not depressed and a "span" voltage magnitude near the power supply value when said key is depressed, and said first threshold has a value of about 50% between said zero and span voltages, and said second threshold has a value of about 75% between said zero and span voltages.

24. The electronic keyboard musical instrument key position and velocity detector as recited in claim 21, further comprising creating a tone of a particular audio frequency upon actuation of said key as determined by said electrical signal crossing at least one of said first and second thresholds, and determining both volume and timbre of the tone based upon the elapsed time between said first and second threshold crossings.

25. An improved electronic keyboard musical instrument including a plurality of keys, each of said keys being movable by a human user's finger in a substantially vertical direction, each of said keys having a surface, said keys being mounted on a structure and located adjacent to one another, the improvement comprising: a key position and velocity sensing assembly that is placed beneath said plurality of keys, and which detects position and velocity of each of said keys without any modification to said keys, said key position and velocity sensing assembly comprising:
(a) a plurality of light sources, one being positioned beneath each said key, each said light source emitting optical energy that is aimed at a surface of one of said keys, wherein at least a portion of said optical energy is reflected from said surface;
(b) a plurality of light detectors, one being positioned beneath each said key to receive at least a portion of the optical energy reflected by said surface, each of said light detectors producing an analog electrical signal upon its reception of said reflected optical energy, each said electrical signal having a magnitude that is related to a distance between said light detector and the surface of said key; and
(c) a processing circuit that receives said electrical signals produced by said plurality of light detectors, said processing circuit including a comparator that is responsive to at least one of the electrical signals produced by said plurality of light detectors, said comparator having two thresholds, a first threshold which is used to determine that the distance between said light detector and said key has changed, and a second threshold which is used to determine the velocity of the key and the user's finger as the distance between said light detector and said key varies, said processing circuit producing an output per said key which is not dependent upon any mechanical action other than movement solely of said keys.

\* \* \* \* \*